(12) United States Patent
Kim

(10) Patent No.: US 11,036,601 B2
(45) Date of Patent: *Jun. 15, 2021

(54) MEMORY MODULE, MEMORY SYSTEM INCLUDING THE SAME AND OPERATION METHOD THEREOF

(71) Applicant: SK hynix Inc., Gyeonggi-do (KR)

(72) Inventor: Joon-Woo Kim, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/593,700

(22) Filed: Oct. 4, 2019

(65) Prior Publication Data
US 2020/0034259 A1   Jan. 30, 2020

Related U.S. Application Data

(63) Continuation of application No. 16/222,624, filed on Dec. 17, 2018, now Pat. No. 10,437,692, which is a
(Continued)

(30) Foreign Application Priority Data
Jan. 17, 2017  (KR) .................. 10-2017-0008231

(51) Int. Cl.
| G11C 7/00 | (2006.01) |
| G06F 11/20 | (2006.01) |
| G06F 11/10 | (2006.01) |
| G11C 29/52 | (2006.01) |
| G06F 12/10 | (2016.01) |
| G11C 5/04 | (2006.01) |
| G06F 12/02 | (2006.01) |
| G11C 29/00 | (2006.01) |

(52) U.S. Cl.
CPC ...... *G06F 11/2094* (2013.01); *G06F 11/1048* (2013.01); *G06F 11/1068* (2013.01); *G06F 12/0292* (2013.01); *G06F 12/10* (2013.01); *G11C 5/04* (2013.01); *G11C 29/52* (2013.01); *G06F 2201/805* (2013.01); *G06F 2201/82* (2013.01); *G06F 2212/1032* (2013.01); *G11C 29/70* (2013.01)

(58) Field of Classification Search
CPC ............ G06F 11/2094; G06F 11/1048; G06F 11/1068; G06F 12/292; G06F 12/10; G06F 5/04; G06F 29/52; G11C 5/04; G11C 29/52; G11C 29/70
See application file for complete search history.

(56) References Cited

U.S. PATENT DOCUMENTS 9,183,166 B2 * 11/2015 Shaeffer .............. G06F 13/4022
9,195,602 B2 * 11/2015 Hampel .............. G11C 7/1003
(Continued)

*Primary Examiner* — Pho M Luu
(74) *Attorney, Agent, or Firm* — IP & T Group LLP

(57) ABSTRACT

A memory module may include a first memory module comprising a plurality of first memory devices each having an extra memory region, a second memory module comprising a plurality of second memory devices each having an extra memory region, and a control logic suitable for writing/reading data to/from the first memory devices, wherein the control logic writes/reads target data to be transferred to/from a third memory device having an error among the first memory devices, to/from the extra memory regions of the second memory devices.

20 Claims, 5 Drawing Sheets

Related U.S. Application Data continuation of application No. 15/715,248, filed on Sep. 26, 2017, now Pat. No. 10,176,066.

(56) References Cited

U.S. PATENT DOCUMENTS

| | | | | |
|---|---|---|---|---|
| 10,176,066 B2 * | 1/2019 | Kim | ................... | G06F 11/2094 |
| 10,241,940 B2 * | 3/2019 | Ware | ..................... | G11C 7/10 |
| 10,437,692 B2 * | 10/2019 | Kim | ................... | G06F 11/1048 |

* cited by examiner

MEMORY MODULE, MEMORY SYSTEM INCLUDING THE SAME AND OPERATION METHOD THEREOF

CROSS-REFERENCE TO RELATED APPLICATIONS

This application is a continuation of U.S. patent application Ser. No. 16/222,624 filed on Dec. 17, 2018 and issued on Oct. 8, 2019 as U.S. Pat. No. 10,437,692, which is a continuation of Ser. No. 15/715,248 filed on Sep. 26, 2017 and issued on Jan. 8, 2019 as U.S. Pat. No. 10,176,066, which claims benefits of priority of Korean Patent Application No. 10-2017-0008231 filed on Jan. 17, 2017. The disclosure of each of the foregoing applications is incorporated herein by reference in its entirety.

BACKGROUND

1. Field

Various embodiments relate to a memory system including a memory device and, more particularly, to a memory system capable of repairing a memory device in which an error has occurred, and an operation method thereof.

2. Description of the Related Art

A memory system is applied to various electronic devices for consumers or industry, for example, computers, mobile phones, PDA (Portable Digital Assistants), digital cameras, game machines, navigation systems and the like, and used as a main memory device or secondary memory device. Memory devices constituting the memory system may be divided into volatile memory devices such as DRAM (Dynamic Random Access Memory) and SRAM (Static RAM) and nonvolatile memory devices such as ROM (Read Only Memory), MROM (Mask ROM), PROM (Programmable ROM), EPROM (Erasable Programmable ROM), EEPROM (Electrically Erasable Programmable ROM), FRAM (Ferroelectric RAM), PRAM (Phase-change RAM), MRAM (Magnetoresistive RAM), RRAM (Resistive RAM) and flash memory.

Among the memory devices, DRAM has been continuously scaled down in order to satisfy the demand for a larger memory capacity in smaller chips. To accommodate further increases in capacity and operation speed required by memory systems, multiple DRAMs may be packaged into a memory module and applied to a memory system. For example, a plurality of memory devices may be packaged in the form of a module integrated on a PCB (Printed Circuit Board), and mounted in a PC or the like through a slot. Among the various modules which are applied to various systems, a module in common use is a DIMM (Dual In-line Memory Module). A DIMM which can be used as a main memory in a computing platform may include a plurality of DRAMs mounted and accessed in parallel.

With the development of more advanced memory systems, the number of DRAMs included in one memory module has gradually increased. Furthermore, for faster operations of the memory systems, the plurality of DRAMs included in the memory module may be accessed in parallel to input/output data during one write/read operation. When a memory module is implemented with a multi-rank scheme in which two or more ranks, each having a plurality of DRAMs, are provided, all DRAMs included in the same rank may simultaneously input/output data. That is, data may be written to/read from the DRAMs on a rank basis. Therefore, when an error occurs in any one DRAM included in the memory module during such a write/read operation and the error-occurred DRAM is processed as a failure or chipkill, remaining DRAMs included in the same rank as the error-occurred DRAM cannot normally perform a write/read operation. Therefore, there is a demand for research on a method capable of effectively processing data of DRAM having an error therein in a memory system which operates on a rank basis.

SUMMARY

Various embodiments are directed to a memory system capable of replacing a memory device having an error therein, among a plurality of memory devices processing data in parallel, with extra memory regions, and an operation method thereof.

In accordance with an embodiment of the present invention, a memory module includes a first memory module comprising a plurality of first memory devices each having an extra memory region; a second memory module comprising a plurality of second memory devices each having an extra memory region; and a control logic suitable for writing/reading data to/from the first memory devices, wherein the control logic writes/reads target data to be transferred to/from a third memory device having an error among the first memory devices, to/from the extra memory regions of the second memory devices.

In accordance with an embodiment of the present invention, a memory system includes a plurality of memory modules each comprising memory devices having an extra memory region; and a memory controller suitable for writing/reading data to/from memory devices of a first memory module selected among the plurality of memory modules, wherein the memory controller writes/reads target data to be transferred to/from a first memory device having an error occurred among the memory devices of the first memory module, to/from extra memory regions of memory devices of a second memory module different from the first memory module among the plurality of memory modules.

In accordance with an embodiment of the present invention, an operation method of a memory system includes providing first and second memory modules including first and second memory devices, respectively; receiving a write command/address and write data corresponding to the first memory module; generating first and second commands/addresses corresponding to the first and second memory modules, respectively, based on detection information indicating a third memory device having an error occurred among the first memory devices, in response to the write command/address; writing the write data to the first memory devices according to the first command/address; and writing target data to be transferred to the third memory device among the write data, to extra memory regions of the second memory devices according to the second command/address, based on the detection information.

In accordance with an embodiment of the present invention, an operation method of a memory system includes providing first and second memory modules including first and second memory devices, respectively; receiving a read command/address corresponding to the first memory module; generating first and second commands/addresses corresponding to the first and second memory modules, respectively, based on detection information indicating a third memory device having an error occurred among the first memory devices, in response to the read command/address;

reading target data from the extra memory regions of the second memory devices according to the second command/address, based on the detection information; reading read data from the first memory devices according to the first command/address; and combining the target data with the read data, based on the detection information.

DETAILED DESCRIPTION

Figure 1:
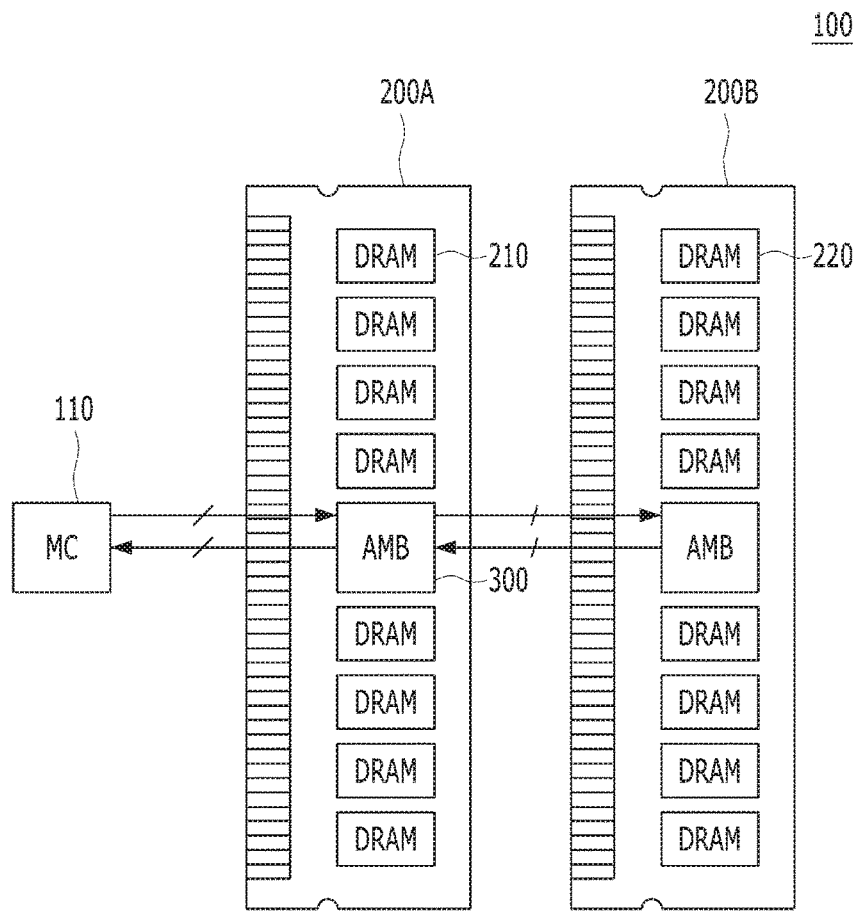
FIG. 1 is a block diagram illustrating a memory system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a memory system 100 in accordance with an embodiment of the present invention.

As illustrated in FIG. 1, the memory system 100 may include a memory controller (MC) 110 and a memory module having a plurality of memory devices DRAM mounted thereon. The memory module may include first and second memory modules 200A and 200B. The first memory module 200A may include first memory devices 210 of a first rank, and the second memory module 200B may include second memory devices 220 of a second rank. At this time, the first and second memory modules 200A and 200B may correspond to the two surfaces of a single PCB, respectively.

However, we note that the present embodiment is not limited thereto, and that the memory system 100 may include a plurality of memory modules. The memory controller 110 may write/read data requested from a host (not illustrated) to/from memory devices of a selected memory module among the plurality of memory modules. That is, the memory controller 110 may perform a write/read operation on a rank basis including a plurality of memory devices. Through one write/read operation, data may be written to/read from memory cells at the same positions in all of the memory devices of the selected memory module.

Referring to FIG. 1, the memory system 100 may include a control logic 300 for controlling the memory modules 200A and 200B. For example, when the memory modules 200A and 200B are Fully Buffered Dual In-line Memory Modules (FBDIMMs) as illustrated in FIG. 1, the control logic 300 may be embedded as an Advanced Memory Buffer (AMB) in the memory modules 200A and 200B. However, the present embodiment is not limited thereto. For example, the control logic 300 may be included in the memory controller 110, and this configuration will be described in more detail with reference to FIG. 5.

Each of the memory modules 200A and 200B implemented in the form of FBDIMM may communicate with the memory controller 110, and the memory controller 110 and the AMBs of the memory modules 200A and 200B may be connected in a point-to-point manner. The AMB embedded in one memory module and the ABM embedded in the other memory module may transmit/receive packets to/from each other. This architecture can increase the number of memory modules connected to the memory system 100, thus, the capacity of the memory system 100 can be increased. Furthermore, the FBDIMM uses a packet protocol, and, hence, the memory system 100 can operate at high speed. In accordance with another embodiment, however, the memory modules 200A and 200B may be implemented in the form of an Unbuffered Dual In-line Memory Module (UDIMM), a Registered Dual In-line Memory Module (RDIMM) or a Load Reduced Dual In-line Memory Module (RDIMM).

Figure 2:
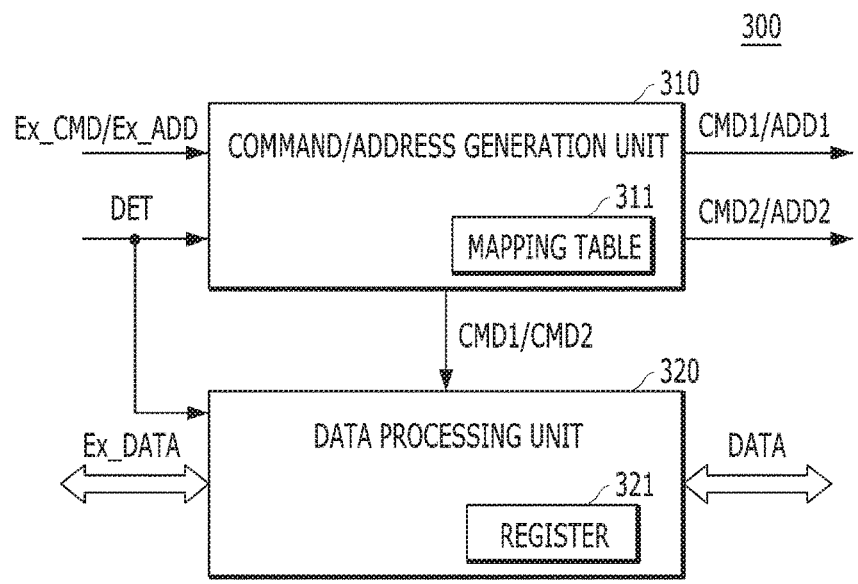
FIG. 2 is a block diagram illustrating a control logic illustrated in FIG. 1.

FIG. 2 is a block diagram illustrating the control logic 300 illustrated in FIG. 1. For example, FIG. 2 representatively may illustrate the control logic 300 included in the first memory module 200A.

The control logic 300 serving as the AMB of the first memory module 200A may buffer data received from the host (not shown), and output the buffered data to the first memory devices 210. The host may be operatively coupled to the memory system 100 via the memory controller 110. Also, the control logic 300 may buffer data received from the first memory devices 210, and output the buffered data to the memory controller 110. That is, the control logic 300 may correspond to the first memory module 200A and write/read data requested from the memory controller 110 to/from the first memory devices 210 in the first memory module 200A.

For this operation, the control logic 300 may include a command/address generation unit 310 and a data processing unit 320. The command/address generation unit 310 may generate a first command/address CMD1/ADD1 corresponding to the first memory module 200A by decoding an external command/address Ex_CMD/Ex_ADD inputted from the memory controller 110. At this time, the first address ADD1 may indicate memory cells at the same positions corresponding to the external address Ex_ADD, in the first memory devices 210.

The data processing unit 320 may receive external data Ex_DATA from the memory controller 110 and output the received data as internal data DATA to the first memory devices 210 in the first memory module 200A, or receive internal data DATA from the first memory devices 210 and output the received data as external data Ex_DATA to the memory controller 110. In response to the first command CMD1 generated by the command/address generation unit 310, the data processing unit 320 may output write data received from the memory controller 110 to the first memory devices 210, or output read data received from the first memory devices 210 to the memory controller 110.

In accordance with the present embodiment, when an error occurs in a memory device among the first memory devices 210 of the first memory module 200A, the control logic 300 may write/read data to be transferred to/from the error-occurred memory device, to/from memory devices of another memory module, for example, the second memory devices 220 of the second memory module 200B. Specifically, the control logic 300 can write/read the data to/from extra memory regions of the second memory devices 220, and the extra memory regions of the memory devices 210 and 220 will be described in more detail with reference to FIG. 4.

For this operation, the command/address generation unit 310 may receive detection information DET from the memory controller 110. The detection information DET may indicate a memory device in which an error has occurred, among the first memory devices 210 of the first memory module 200A. Based on the detection information DET, the command/address generation unit 310 may map an address of the error-occurred memory device to one or more addresses of the extra memory regions of the second memory devices 220. The command/address generation unit 310 may include a mapping table 311 to store address mapping information between the error-occurred memory device of the first memory devices 210 and the extra memory regions of the second memory devices 220.

Based on the address mapping information, the command/address generation unit 310 may generate a second command/address CMD2/ADD2 corresponding to the second memory module 200B by decoding the external command/address Ex_CMD/Ex_ADD. At this time, the second address ADD2 may indicate the extra memory regions of the second memory devices 220.

During a write operation, the data processing unit 320 may receive the external data Ex_DATA as write data from the memory controller 110, and separately store data (hereinafter, referred to as "target data") to be transferred to the error-occurred memory device, among the write data, based on the detection information DET in response to the second command CMD2. In accordance with the present embodiment, the data processing unit 320 may include a register 321 to store the target data. Since the detection information DET indicates a position of the error-occurred memory device, among the first memory devices 210, the data processing unit 320 may store the target data among the write data. As described above, after outputting the write data received from the memory controller 110 to the first memory devices 210 in response to the first command CMD1, the data processing unit 320 may output the target data stored in the register 321 to the second memory module 200B in response to the second command CMD2.

During a read operation, the data processing unit 320 may separately store data read from the extra memory regions of the second memory devices 220, as target data, in the register 321 based on the detection information DET in response to the second command CMD2. When receiving read data from the first memory devices 210 as the internal data DATA in response to the first command CMD1, the data processing unit 320 may combine the target data stored in the register 321 with the read data from the first memory devices 210 based on the detection information DET, and output the combined data to the memory controller 110 as the external data Ex_DATA.

Figure 3A:
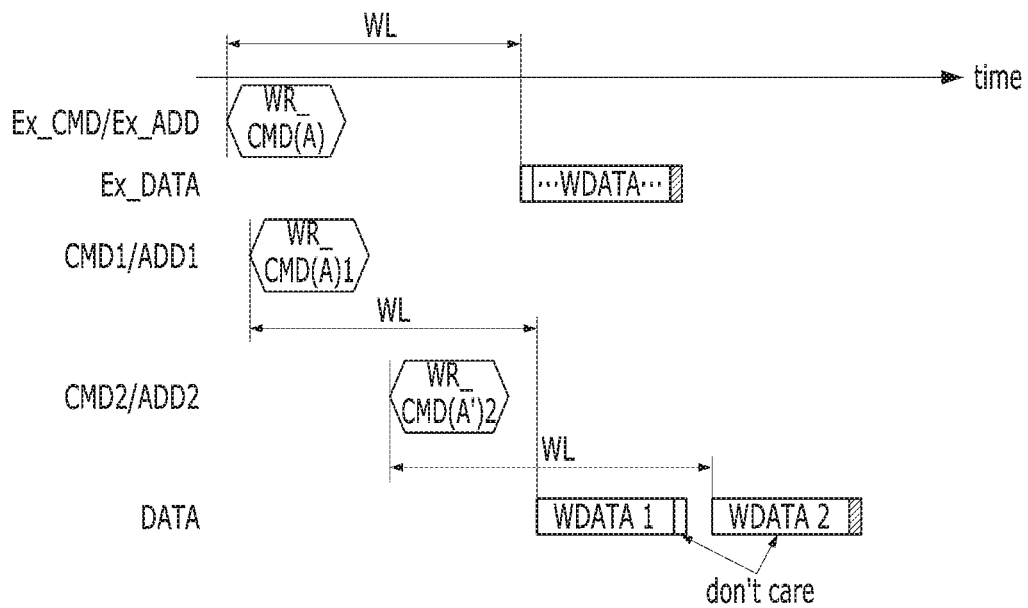
FIGS. 3A and 3B are timing diagrams describing an operation of the control logic illustrated in FIG. 2.
Figure 3B:
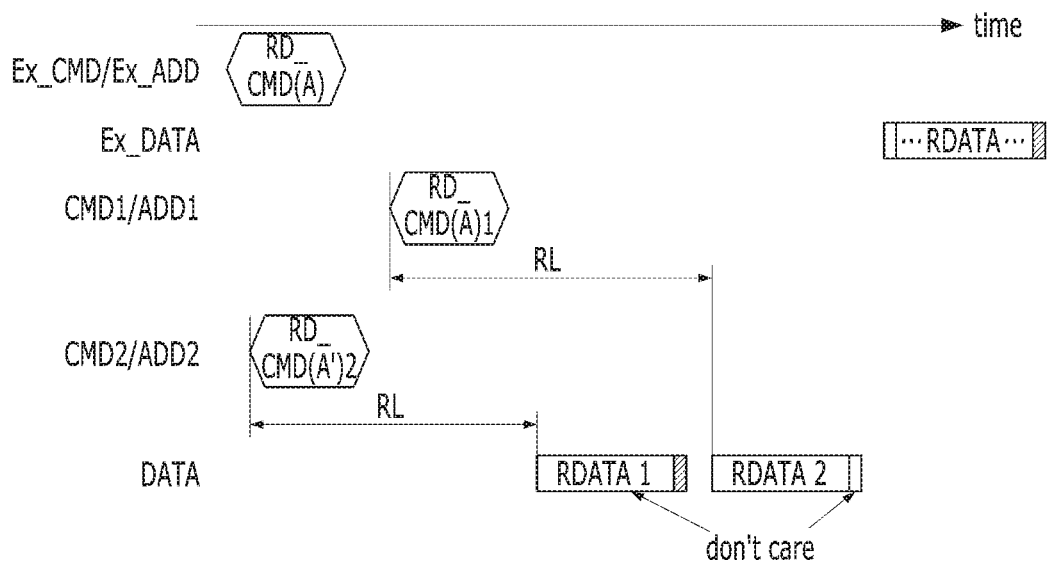

FIGS. 3A and 3B are timing diagrams for describing an operation of the control logic 300 illustrated in FIG. 2. FIG. 3A illustrates timings at which the first and second commands/addresses CMD1/ADD1 and CMD2/ADD2 are generated by the control logic 300 during a write operation of the memory system 100, and FIG. 3B illustrates timings at which the first and second commands/addresses CMD1/ADD1 and CMD2/ADD2 are generated by the control logic 300 during a read operation of the memory system 100.

Referring to FIG. 3A, the memory controller 110 may generate and send a write command/address WR_CMD(A) as the external command/address Ex_CMD/Ex_ADD to the control logic 300. Since the memory controller 110 performs a write operation on a rank basis, the memory controller 110 may generate the write command/address WR_CMD(A) to select a specific row/column for all of the memory devices 210 of the first memory module 200A. The write command/address WR_CMD(A) may be inputted as one packet, and the control logic 300 may generate first and second write commands/addresses WR_CMD(A)1 and WR_CMD(A')2 by decoding the write command/address WR_CMD(A).

The command/address generation unit 310 may generate the first write command/address WR_CMD(A)1 as the first command/address CMD1/ADD1 corresponding to the first memory module 200A by decoding the write command/address WR_CMD(A). Furthermore, the command/address generation unit 310 may generate the second write command/address WR_CMD(A')2 as the second command/address CMD2/ADD2 corresponding to the second memory module 200B by decoding the write command/address WR_CMD(A) based on the address mapping information stored in the mapping table 311.

FIG. 3A illustrates the case in which an error occurrence has been detected in the last memory device among the memory devices 210 of the first memory module 200A. Since the addresses of the last memory device of the memory devices 210 in the first memory module 200A and the extra memory regions of the memory devices 220 in the second memory module 200B are mapped to each other in the mapping table 311, the command/address generation unit 310 may generate the second write command/address WR_CMD(A')2 corresponding to the extra memory regions of the memory devices 220.

After write latency WL from the input of the write command/address WR_CMD(A), write data WDATA may be inputted as the external data Ex_DATA. The write data WDATA may be sequentially inputted corresponding to the respective memory devices 210 of the first memory module 200A. The data processing unit 320 may output first write data WDATA1 as the internal data DATA to the memory devices 210 in response to the first write command/address WR_CMD(A)1. The data processing unit 320 may output the first write data WDATA1 after the write latency WL from the input of the first write command/address WR_CMD(A)1. At this time, target data to be transferred to the last memory device of the first memory module 200A, among the first write data WDATA1, may be outputted as is, or outputted as a value set to '0' or '1'. That is, since the last memory device in which the error occurrence has been detected is not used any more, the write operation of the last memory device may be ignored. The last data of the first write data WDATA1, described as 'don't care' in FIG. 3A, may be set to any value. On the other hand, the remaining memory devices of the first memory module 200A may write the first write data WDATA1 according to the first write command/address WR_CMD(A)1.

In response to the second write command/address WR_CMD(A')2, the data processing unit 320 may store the target data in the register 321 based on the detection information DET. When the detection information DET indicates the last memory device, the data processing unit 320 may separately store the last data (hatched portion in FIG. 3A) of the write data WDATA as the target data in the register 321.

The data processing unit 320 may output second write data WDATA2 containing the target data stored in the register 321, to the second memory module 200B in response to the second write command/address WR_CMD(A')2. The data processing unit 320 may output the second write data WDATA2 after the write latency WL from the input of the second write command/address WR_CMD(A')

2. At this time, the rest data excluding the target data from the second write data WDATA2 having the burst length may be outputted as values set to '0' or '1'. The memory devices 220 of the second memory module 200E may write the second write data WDATA2 to the extra memory regions corresponding to the second write command/address WR_CMD(A')2. In particular, the last memory device among the memory devices 220 may store data in the extra memory regions thereof, the data corresponding to the target data stored in the register 321.

Referring to FIG. 3B, the memory controller 110 may generate and send a read command/address RD_CMD(A) as the external command/address Ex_CMD/Ex_ADD to the control logic 300. Since the memory controller 110 performs a read operation on a rank basis, the memory controller 110 may generate the read command/address RD_CMD(A) to select a specific row/column for all of the memory devices 210 of the first memory module 200A. The read command/address RD_CMD(A) may also be inputted as one packet, and the control logic 300 may generate first and second read commands/addresses RD_CMD(A)1 and RD_CMD(A')2 by decoding the read command/address RD_CMD(A).

The command/address generation unit 310 may generate the second read command/address RD_CMD(A')2 as the second command/address CMD2/ADD2 corresponding to the second memory module 200B by decoding the read command/address RD_CMD(A) based on the address mapping information stored in the mapping table 311. Also, the command/address generation unit 310 may generate the first read command/address RD_CMD(A)1 as the first command/address CMD1/ADD1 corresponding to the first memory module 200A by decoding the read command/address RD_CMD(A).

FIG. 3B illustrates the case in which an error occurrence has been detected in the last memory device among the memory devices 210 of the first memory module 200A. Since the addresses of the last memory device of the memory devices 210 in the first memory module 200A and the extra memory regions of the memory devices 220 of the second memory module 200B are mapped to each other in the mapping table 311, the command/address generation unit 310 can generate the second read command/address RD_CMD(A')2 corresponding to the extra memory regions of the memory devices 220.

According to the second read command/address RD_CMD(A')2, first read data RDATA1 may be read from the second memory module 200B as the internal data DATA. The data processing unit 320 may receive the first read data RDATA1 after read latency RL from the output of the second command/address RD_CMD(A')2, and store the last data (hatched portion in FIG. 3B) of the first read data RDATA1, as target data, based on the detection information DET. The data processing unit 320 may store the target data in the register 321.

Then, the data processing unit 320 may receive second read data RDATA2 from the memory devices 210 as the internal data DATA after the read latency RL from the output of the first command/address RD_CMD(A)1. When the second read data RDATA2 are received, the data processing unit 320 may combine the target data with the second read data RDATA2, and output read data RDATA to the memory controller 110. In FIG. 33, the data processing unit 320 may add the target data to the last portion of the second read data RDATA2 based on the detection information DET, and output the read data RDATA as the external data Ex_DATA.

Figure 4:
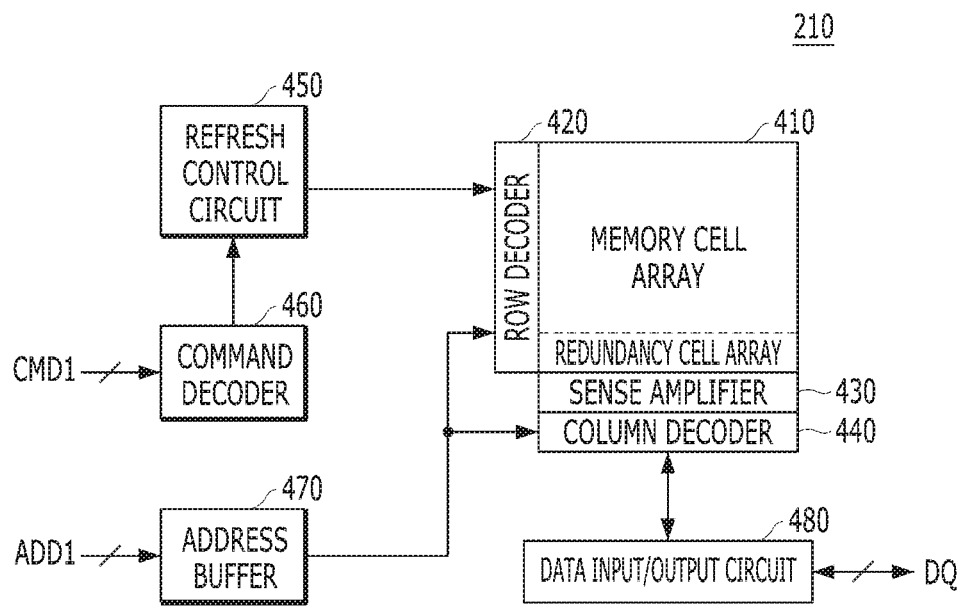
FIG. 4 is a block diagram illustrating a memory device illustrated in FIG. 1.

FIG. 4 is a block diagram illustrating the memory device 210 illustrated in FIG. 1. For example, FIG. 4 representatively illustrates the memory device 210 included in the first memory module 200A.

Referring to FIG. 4, the memory device 210 may include a memory cell array 410, a row decoder 420, a sense amplifier 430, a column decoder 440, a refresh control circuit 450, a command decoder 460, an address buffer 470 and a data input/output circuit 480.

The memory cell array 410 may include a plurality of memory cells arranged in row and column directions. The plurality of memory cells may include not only memory cells used for storing data, but also redundancy cells for replacing memory cells in which an error has occurred. The redundancy cells may have the same structure as the memory cells, and a redundancy cell array including the redundancy cells may be used as the extra memory region of the memory device 210.

The command decoder 460 may receive a command CMD1 from the control logic (300 of FIG. 1), and internally generate control signals by decoding the command CMD1. The control signals may include an active signal, read signal, write signal and refresh signal. The refresh control circuit 450 may receive the refresh signal from the command decoder 460, and output a row address to the row decoder 420 in order to refresh one word line of the memory cell array 410.

The control logic 300 may transmit an address ADD1 with the command CMD1 to the memory device 210, the address ADD1 designating a memory cell to/from which data is to be written/read. The address buffer 470 may receive the address ADD1 from the control logic 300 and generate row/column addresses.

The row decoder 420 may decode the row address which is outputted from the refresh control circuit 450 or the address buffer 470 in order to designate one word line of the memory cell array 410. That is, the row decoder 420 may decode the row address outputted from the address buffer 470 and enable a word line coupled to a memory cell to/from which data is to be written/read, during a write/read operation. Furthermore, the row decoder 420 may refresh the word line corresponding to the row address outputted from the refresh control circuit 450.

The sense amplifier 430 may sense and amplify data of the memory cell coupled to the word line designated by the row decoder 420, and store the data of the memory cell. The column decoder 440 may decode the column address outputted from the address buffer 470, in order to designate one or more bit lines coupled to one or more memory cells to or from which data is to be inputted or outputted.

The data input/output circuit 480 may output data received from the memory cell in the memory cell array 410 through the sense amplifier 430, or input data to the corresponding memory cell. As a result, the data inputted through the data input/output circuit 480 may be written to the memory cell array 410 based on the address ADD1, or the data read from the memory cell array 410 based on the address ADD1 may be outputted to the control logic 300 through the data input/output circuit 480.

Figure 5:
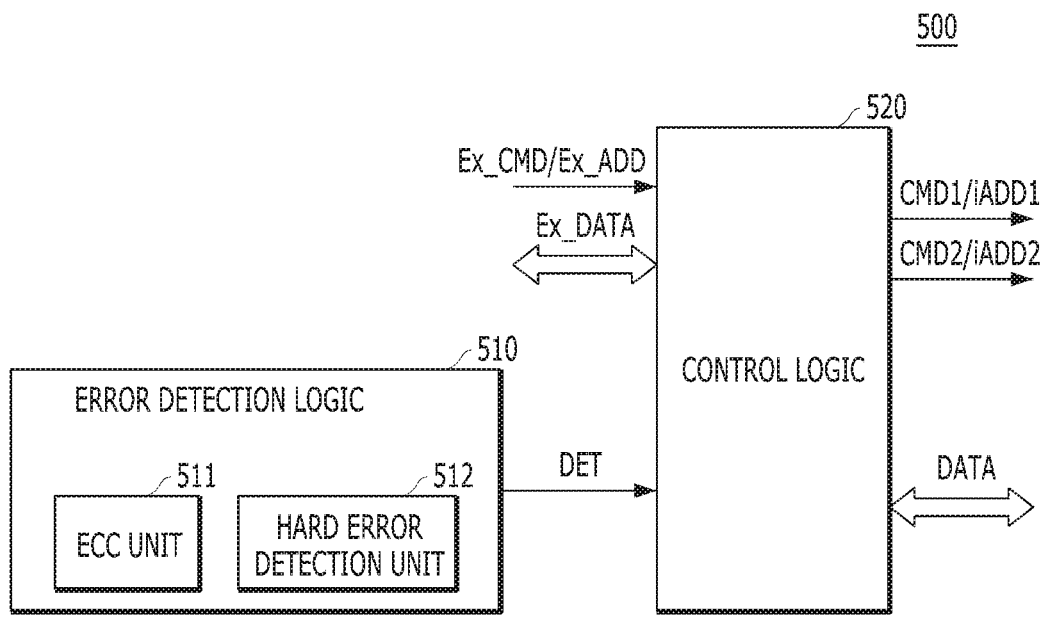
FIG. 5 is a block diagram illustrating a memory controller in accordance with an embodiment of the present invention.

FIG. 5 is a block diagram illustrating a memory controller 500 in accordance with an embodiment of the present invention.

Referring to FIG. 5, the memory controller 500 may include error detection logic 510 and a control logic 520. As described with reference to the memory controller 110 of FIG. 1, the memory controller 500 may write/read data requested from a host (not illustrated) to/from memory devices of a selected memory module between the plurality of memory modules 200A and 200B, for example, the memory devices 210 of the first memory module 200A. At this time, the memory controller 500 may write/read data to be transferred to/from a memory device in which an error has occurred among the memory devices 210 of the first memory module 200A, to/from the extra memory regions of the memory devices of the remaining memory module between the plurality of memory modules 200A and 200B, for example, the second memory module 220B.

The error detection logic 510 may detect the error-occurred memory device, among the memory devices of the plurality of memory modules 200A and 200B, and generate the detection information DET. The error detection logic 510 may include an error correction code (ECC) unit 511 and a hard error detection unit 512. The ECC unit 511 may detect and correct an error which occurred in read data received from the memory modules 200A and 200B. The ECC unit 511 may check the error in the received read data, using any one algorithm among a plurality of algorithms such as parity, single error correct-double error detect (SECDED), chipkill and the like.

When the ECC unit 511 detects the error, the ECC unit 511 may transmit information on the error to the hard error detection unit 512. The hard error detection unit 512 may determine whether the detected error is a hard error or soft error. The term "soft error" may not indicate a result of a hardware fault, but indicate an error in stored information (for example, an error caused by an alpha strike). The term "hard error" may indicate an error caused by a hardware fault.

For example, the hard error detection unit 512 may determine whether the error is a hard error or soft error, based on whether the error is persistent. The hard error detection unit 512 may perform a replay operation of repeatedly writing/reading data multiple times, in order to determine whether the error bits of the data are persistent. Therefore, the error detection logic 510 may detect a memory device in which a hard error has occurred, among the memory devices of the memory modules 200A and 200B, and generate the detection information DET corresponding to the detected memory device.

In order to guarantee the reliability of the data stored in the memory modules 200A and 200B, the memory device in which the occurrence of the hard error was detected by the error detection logic 510 may not be used any more. Therefore, the control logic 520 may map the address of the memory device having the hard error therein in the first memory module 200A to the addresses of the extra memory regions of the memory devices 220 of the second memory module 200B, based on the detection information DET, and store the address mapping information therebetween. The control logic 520 may generate the first command/address CMD1/ADD1 corresponding to the first memory module 200A by decoding the external command/address Ex_CMD/Ex_ADD for selecting the memory devices 210 of the first memory module 200A, and generate the second command/address CMD2/ADD2 corresponding to the second memory module 200B according to the address mapping information.

During the write operation, the control logic 520 may write target data to be transferred to the error-occurred memory device, to the extra memory regions of the memory devices 220 of the second memory module 200B according to the second command/address CMD2/ADD2, based on the detection information DET, while writing write data to the memory devices 210 of the first memory module 200A according to the first command/address CMD1/ADD1. During the read operation, the control logic 520 may read target data from the extra memory regions of the memory devices 220 of the second memory module 200B according to the second command/address CMD2/ADD2, based on the detection information DET, while reading read data from the memory devices 210 of the first memory module 200A according to the first command/address CMD1/ADD1. Since the control logic 520 can be configured in a similar manner to the control logic 300 illustrated in FIG. 2, the duplicated descriptions of the operation and configuration related to the control logic 300 are omitted herein.

Hereinafter, referring to FIGS. 1 to 6B, operations of a memory system will be described.

Figure 6A:
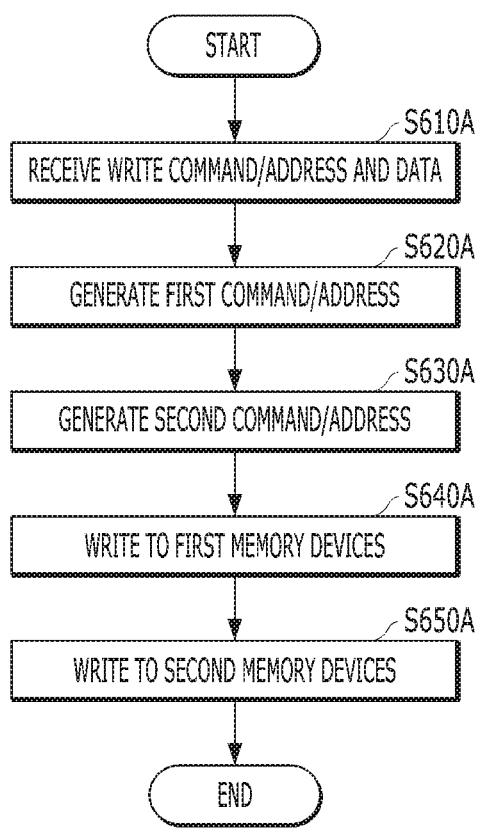
FIGS. 6A and 6B are flowcharts describing write and read operations of a memory system in accordance with embodiments of the present invention.
Figure 6B:
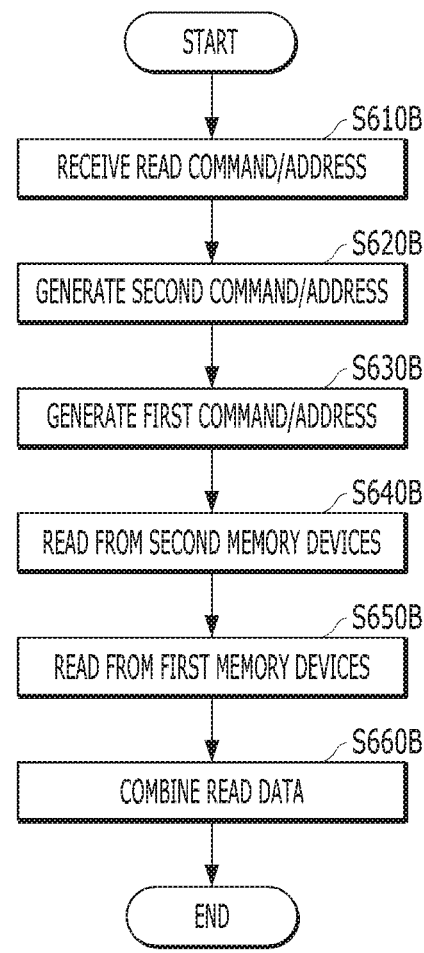

FIGS. 6A and 6B are flowcharts for describing write and read operations of a memory system in accordance with embodiments of the present invention.

FIG. 6A is a flowchart for describing the write operation of the memory system in accordance with a present embodiment. Accordingly, a write operation may include the following steps S610A to S650A.

1) Receive a Write Command/Address and Data at Step S610A

When the first memory module 200A of FIG. 1 is selected during the write operation, the control logic 300 may receive the write command/address WR_CMD(A) from the memory controller 110. The write command/address WR_CMD(A) may be inputted as one packet which contains a command indicating the write operation and an address indicating a specific row/column for all of the memory devices 210 of the first memory module 200A. During the write operation, the control logic 300 may receive the write data WDATA with the write command/address WR_CMD(A) from the memory controller 110.

2) Generate a First Command/Address at Step S620A

The control logic 300 may generate the first command/address WR_CMD(A)1 in response to the write command/address WR_CMD(A). The command/address generation unit 310 included in the control logic 300 may generate the first command/address WR_CMD(A)1 corresponding to the first memory module 200A by decoding the write command/address WR_CMD(A).

3) Generate a Second Command/Address at Step S630A

Based on the detection information DET indicating a memory device in which an error has occurred among the memory devices 210, the control logic 300 may generate the second command/address WR_CMD(A')2 in response to the write command/address WR_CMD(A). Based on the detection information DET, the control logic 300 may map the address of the error-occurred memory device among the memory devices 210 to the addresses of the extra memory regions of the memory devices 220, and store the address mapping information. Based on the address mapping information, the command/address generation unit 310 may generate the second command/address WR_CMD(A')2 corresponding to the second memory module 200B by decoding the write command/address WR_CMD(A). That is, the second command/address WR_CMD(A')2 may designate the extra memory regions of the memory devices 220.

4) Write to First Memory Devices at Step S640A.

After the write latency WL from the input of the write command/address WR_CMD(A), the write data WDATA may be inputted. The data processing unit 320 included in the control logic 300 may output the write data WDATA as the first write data WDATA1 to the memory devices 210, in response to the first command/address WR_CMD(A)1. According to the first command/address WR_CMD(A)1, the memory devices 210 of the first memory module 200A may write the first write data WDATA(A)1.

5) Write to Second Memory Devices at Step S650A

In response to the second command/address WR_CMD (A')2, the data processing unit 320 may store target data to be transferred to the error-occurred memory device among the write data WDATA, based on the detection information DET. The data processing unit 320 may output the second write data WDATA2 containing the target data to the second memory module 200B. According to the second command/address WR_CMD(A')2, the memory devices 220 of the second memory module 200B may write the second write data WDATA2 to the extra memory regions thereof.

FIG. 6B is a flowchart for describing the read operation of the memory system in accordance with the present embodiment. Accordingly, a read operation may include the following steps S610B to S660B.

1) Receive a Read Command/Address at Step S610B

When the first memory module 200A is selected during the read operation, the control logic 300 may receive the read command/address RD_CMD(A) from the memory controller 110. The read command/address RD_CMD(A) may also be inputted as one packet which contains a command indicating the read operation and an address indicating a specific row/column for all of the memory devices 210 of the first memory module 200A.

2) Generate a Second Command/Address at Step S620B

Based on the detection information DET indicating a memory device in which an error has occurred among the memory devices 210, the control logic 300 may generate the second command/address RD_CMD(A')2 in response to the read command/address RD_CMD(A). As described above, the control logic 300 may store the address mapping information based on the detection information DET. Based on the address mapping information, the command/address generation unit 310 may generate the second command/address RD_CMD(A')2 corresponding to the second memory module 200B by decoding the read command/address RD_CMD(A). That is, the second command/address RD_CMD(A)2 may designate the extra memory regions of the memory devices 220.

3) Generate a First Command/Address at Step S630B

The control logic 300 may generate the first command/address RD_CMD(A)1 in response to the read command/address RD_CMD(A). The command/address generation unit 310 included in the control logic 300 may generate the first command/address RD_CMD(A)1 corresponding to the first memory module 200A by decoding the read command/address RD_CMD(A).

4) Read From Second Memory Devices at Step S640B

According to the second command/address RD_CMD(A')2, the memory devices 220 of the second memory module 200B may read the first read data RDATA1 from the extra memory regions thereof. The data processing unit 320 may receive the first read data RDATA1 after the read latency RL from the output of the second command/address RD_CMD (A')2, and store data corresponding to the error-occurred memory device among the first read data RDATA1, as the target data based on the detection information DET.

5) Read From First Memory Devices at Step S650B

According to the first command/address RD_CMD(A)1, the second read data RDATA2 may be read from the memory devices 210 of the first memory module 200A. The data processing unit 320 may receive the second read data RDATA2 after the read latency RL from the output of the first command/address RD_CMD(A)1.

6) Combine Read Data at Step S660B

When the second read data RDATA2 are received from the memory devices 210, the data processing unit 320 may combine the target data with the second read data RDATA2. The data processing unit 320 may add the target data to a position corresponding to the error-occurred memory device among the second read data RDATA2, based on the detection information DET. The data processing unit 320 may output the combined data as the read data to the memory controller 110.

In accordance with the present embodiments, the memory system and the operation method thereof can process data of a memory device in which an error occurred, using extra memory regions, during a write/read operation for a memory module including a plurality of memory devices. That is, the memory system and the operation method can temporarily store the data of the error-occurred memory device, and process data in parallel during the write/read operation for the plurality of memory devices. Therefore, although an error occurs in any one memory device included in the memory module such that the memory device is processed as a failure, the memory device may not have an influence on a write/read operation performed on a memory module basis, but replace the memory device processed as a failure with extra memory regions. Thus, the memory system and the operation method can reduce an influence on the remaining memory devices by the operation of processing the error-occurred memory device among the plurality of memory devices, and raise the use efficiency of the memory module including the plurality of memory devices.

Although various embodiments have been described for illustrative purposes, it will be apparent to those skilled in the art that various other changes and modifications may be made without departing from the spirit and scope of the invention as defined in the following claims.

What is claimed is:

1. A memory system comprising:
a first memory module comprising a first control logic and a first memory device;
a second memory module comprising a second memory device having an extra memory region; and
a memory controller configured to transfer data between a host and the first control logic,
wherein the first control logic changes memory location from a memory region having an error of the first memory device to the extra memory region of the second memory device.

2. The memory system of claim 1, wherein the second memory module further includes a second control logic configured to transfer data between the memory controller and the second memory device.

3. The memory system of claim 1, wherein the first memory module generates a command or address corresponding to the second memory module by decoding an external command or address received from the memory controller.

4. The memory system of claim 1, wherein the first memory module includes a register to store target-data corresponding to the memory region having the error of the first memory device.

5. The memory system of claim 1, wherein the first memory module and the second memory module are mounted on a single Printed Circuit Board (PCB).

6. The memory system of claim 1, wherein the first control logic includes a data processing unit configured to store target-data corresponding to the memory region having the error of the first memory device among write-data received from the memory controller.

7. The memory system of claim 6, wherein the data processing unit stores data read form the extra memory region of the second memory device as the target-data.

8. The memory system of claim 1, wherein the first control logic includes a command or address generation unit configured to map an address of the memory region having the error of the first memory device to an address of the extra memory region of the second memory device.

9. The memory system of claim 1, wherein the second memory device includes redundancy cells used as the extra memory region.

10. The memory system of claim 1, wherein the memory controller includes a command or address generation unit configured to generate a command or address in response to an external command or address from the host.

11. The memory system of claim 1, wherein the memory controller includes an error detection logic configured to detect the memory region having the error of the first memory device and generate detection information.

12. The memory system of claim 1, wherein the memory controller includes:
   an error correction code unit configured to detect the error of the memory region of the first memory device; and
   a hard error detection unit configured to determine whether the error of the memory region of the first memory device is a hard error or soft error.

13. The memory system of claim 1, wherein the first control logic transfers data between the memory controller and the first memory device and stores address mapping information of the first memory device.

14. A memory system comprising:
   a first memory module comprising a plurality of first memory devices;
   a second memory module comprising a plurality of second memory devices having a plurality of extra memory regions, respectively;
   a third memory module comprising a plurality of third memory devices having a plurality of extra memory regions, respectively; and
   a memory controller configured to transfer data between a host and the memory modules,
   wherein the memory controller changes destination of data from a memory device having an error among the first memory devices to the plurality of extra memory regions of the second memory devices.

15. The memory system of claim 14, wherein the memory controller generates a second command or address corresponding to the second memory module while generating a first command or address corresponding to the first memory module, by decoding an external command or address received from the host.

16. The memory system of claim 14, wherein the memory controller includes a register to store target-data corresponding to the memory device having the error among the first memory devices.

17. The memory system of claim 14, wherein the second memory module and the third memory module are mounted on a single Printed Circuit Board (PCB).

18. The memory system of claim 14, wherein the plurality of second memory devices include redundancy cells used as the plurality of extra memory regions.

19. The memory system of claim 14, wherein the memory controller includes an error correction code unit configured to detect the error of the memory device among the first memory devices; and
   a hard error detection unit configured to determine whether the error of the memory device of the first memory devices is a hard error or a soft error.

20. The memory system of claim 14, wherein the memory controller maps an address of the memory device having the error among the first memory devices to an address of the plurality of extra memory regions of the second memory devices.

* * * * *